US007430120B2

(12) United States Patent
Lau

(10) Patent No.: US 7,430,120 B2
(45) Date of Patent: Sep. 30, 2008

(54) INDUCTION LIGHTING SYSTEM

(76) Inventor: Kenneth Lau, 4327 Point Reyes Ct., Carlsbad, CA (US) 92010

(*) Notice: Subject to any disclaimer, the term of this patent is extended or adjusted under 35 U.S.C. 154(b) by 16 days.

(21) Appl. No.: 11/743,597

(22) Filed: May 2, 2007

(65) Prior Publication Data

US 2007/0262719 A1 Nov. 15, 2007

Related U.S. Application Data

(60) Provisional application No. 60/797,164, filed on May 3, 2006.

(51) Int. Cl.
*H05K 7/20* (2006.01)

(52) U.S. Cl. ....................... 361/709; 361/600; 361/674; 361/676; 362/294; 362/431

(58) Field of Classification Search ................ 361/600, 361/709, 714, 720, 674, 676; 313/634, 160; 362/147, 364, 265, 294, 373, 431; 257/E23.09, 257/E23.102, E25.031

See application file for complete search history.

(56) References Cited

U.S. PATENT DOCUMENTS 3,530,287 A * 9/1970 Husby ........................ 362/645
3,950,639 A * 4/1976 Van Steenhoven .......... 362/309
4,403,277 A * 9/1983 Eargle et al. ............... 362/263
4,535,386 A * 8/1985 Frey et al. .................... 361/714
5,039,903 A * 8/1991 Farrall ........................ 313/160
5,136,493 A * 8/1992 Straus et al. ................ 362/373
5,720,548 A * 2/1998 Geary ........................ 362/260
6,350,046 B1 * 2/2002 Lau ........................... 362/364
6,419,378 B1 * 7/2002 Wedell et al. ............... 362/431
6,601,975 B1 * 8/2003 Haugaard et al. ........... 362/362
7,258,464 B2 * 8/2007 Morris et al. ............... 362/264
7,350,940 B2 * 4/2008 Haugaard et al. ........... 362/294
7,379,291 B2 * 5/2008 Quazi .......................... 361/674
2007/0076352 A1 * 4/2007 Hart ........................... 361/600
2007/0188103 A1 * 8/2007 Ribarich ..................... 313/634
2007/0236869 A1 * 10/2007 Anderson et al. ........... 361/600

* cited by examiner

*Primary Examiner*—Jayprakash N Gandhi
*Assistant Examiner*—Courtney L Smith
(74) *Attorney, Agent, or Firm*—Steven W. Webb

(57) ABSTRACT

An improved induction lighting system is presented where the electronic power supply device powering the induction lamp is insulated and an extensive set of heat sink fins is provided to control the temperature of the power supply. Reduction of power supply device temperature in this manner greatly extends the operational life of these devices.

The improved induction lighting system is designed to be retrofitted into existing induction lighting systems, in all indoor and outdoor lighting applications.

4 Claims, 4 Drawing Sheets

INDUCTION LIGHTING SYSTEM

RELATED APPLICATIONS

This application extends and completes Provisional Patent Application 60/797,164, filed on May 3, 2006.

FIELD OF THE INVENTION

This invention is related to the field of induction lighting, used in both outdoor and indoor lighting.

BACKGROUND OF THE INVENTION

There is a new type of induction lighting system available for sale that can last approximately 100,000 hours before replacement. It is used in applications such as street lighting fixtures that are generally described as a "cobra head", because of their shape.

Associated with this induction lighting system is a heat dissipation problem, caused by radiated heat from the induction lamp to the heat sensitive high-frequency electronic ballast inside the light fixture. Reducing the operating temperature of the lighting fixture by improving the radiation of generated heat can extend the life of these induction lighting systems.

Prior art street lighting fixtures often have a hollow housing containing both the lamp and ballast, not separated by any insulation. This hollow housing can permit lamp temperatures to easily reach between 90 and 100 degrees Centigrade and cause irreversible damage to the electronic ballast.

If the generator can be kept below 65 degrees Centigrade while it is operating, the maximum life for the induction light fixture can be achieved. An improved heat sink system is proposed in the present invention to address the intrinsic heat dissipation problems of induction lighting systems.

OBJECTS OF THE INVENTION

It is an object of the present invention to provide an improved heat sink for induction lighting enclosures.

It is the object of the present invention to provide an isolation chamber for protecting heat sensitive components in induction lighting systems.

It is a further object of this invention to improve the insulation of components within induction lighting enclosures.

It is a further object of this invention to produce an improved heat dissipation system for induction lighting fixtures that is inexpensive to install and can be retrofitted into existing installations with minimal cost.

DETAILED DESCRIPTION

Figure 1:
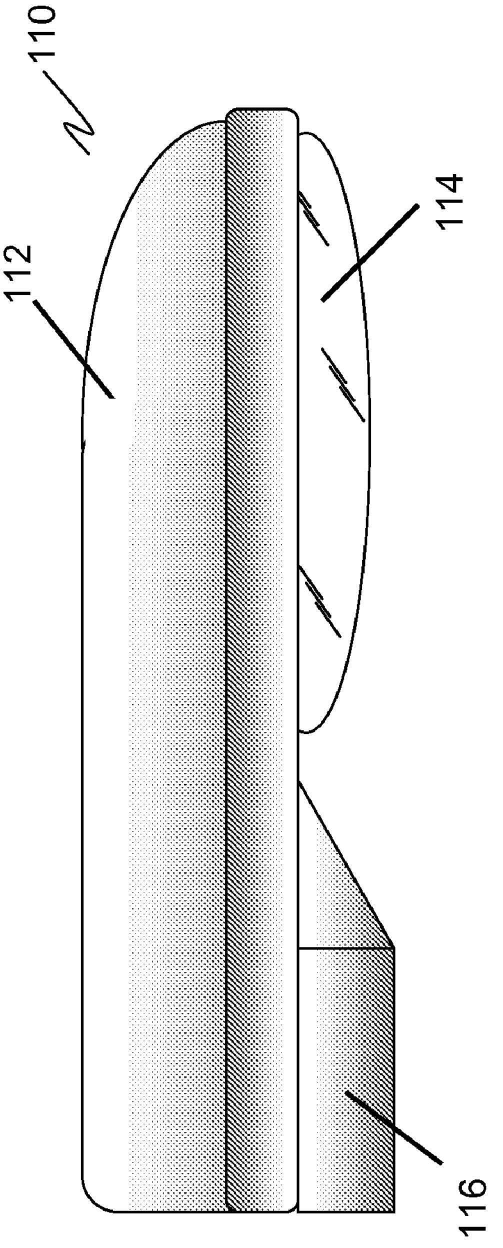
FIG. 1. Cobra-head Induction Lighting Fixture With Gate Closed
Figure 2:
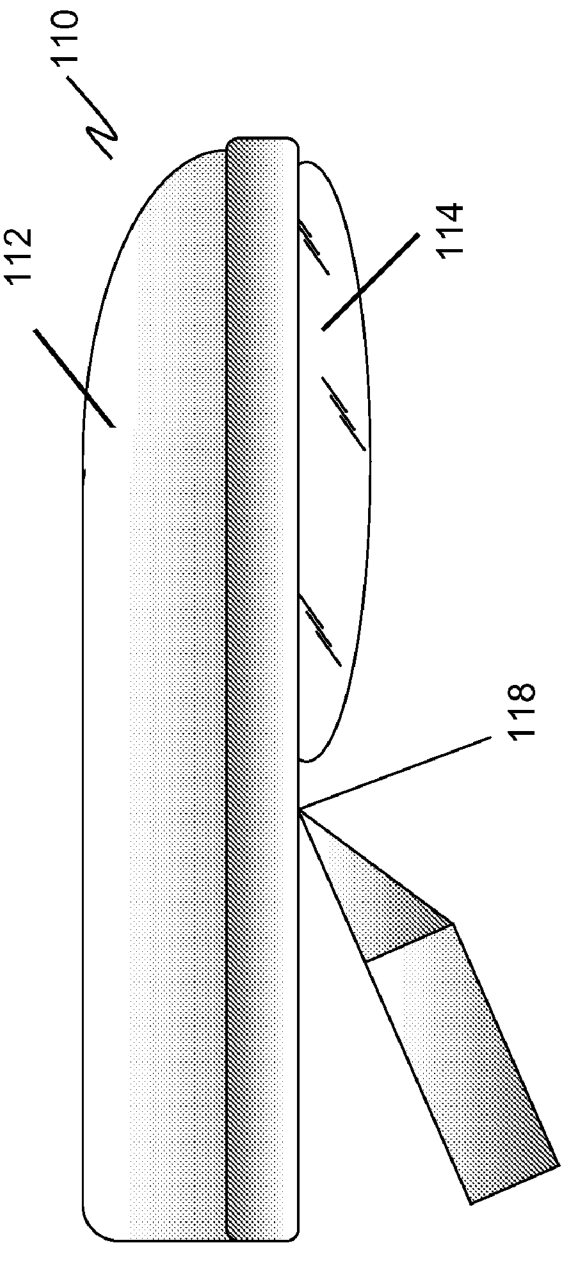
FIG. 2. Cobra-head Induction Lighting Fixture With Gate Open

FIG. 1 and FIG. 2 show the general configuration of a cobra head induction lighting fixture 110. There is an upper housing 112 that contain an interior socket structure within which a lamp or light bulb can be mounted. The street lighting fixture is closed by a transparent or translucent lens 114.

Figure 5:
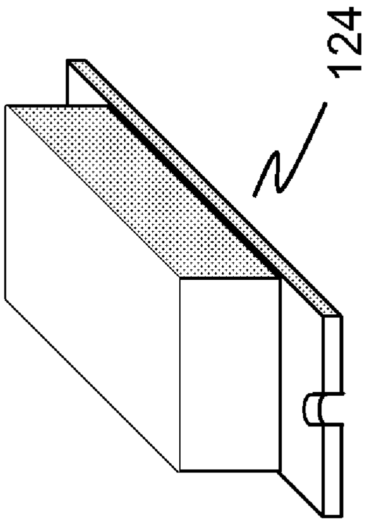
FIG. 5. Typical High-Frequency Ballast
Figure 4:
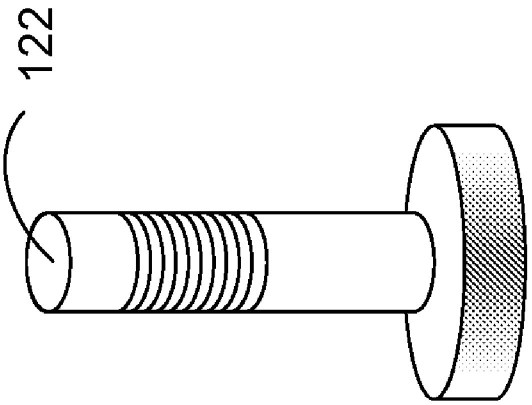
FIG. 4. Power Coupler for Induction Lighting Vessel
Figure 3:
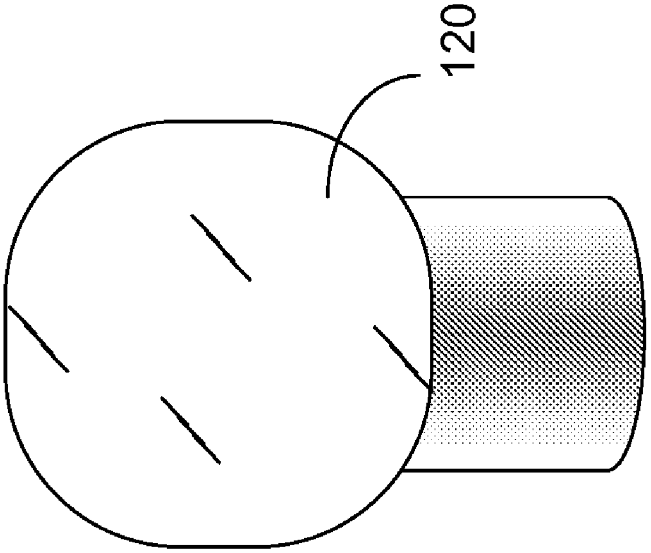
FIG. 3. Typical Induction Lighting Vessel

FIG. 3 shows typical induction vessel or lamp 120. There are other lamp shapes and configurations possible. FIG. 4 shows the induction coupler 122 which mates with the induction vessel 120 during installation. FIG. 5 shows a power stabilizer 124 electronic device, also known as a generator or ballast, that powers the induction lighting system 110.

Figure 6:
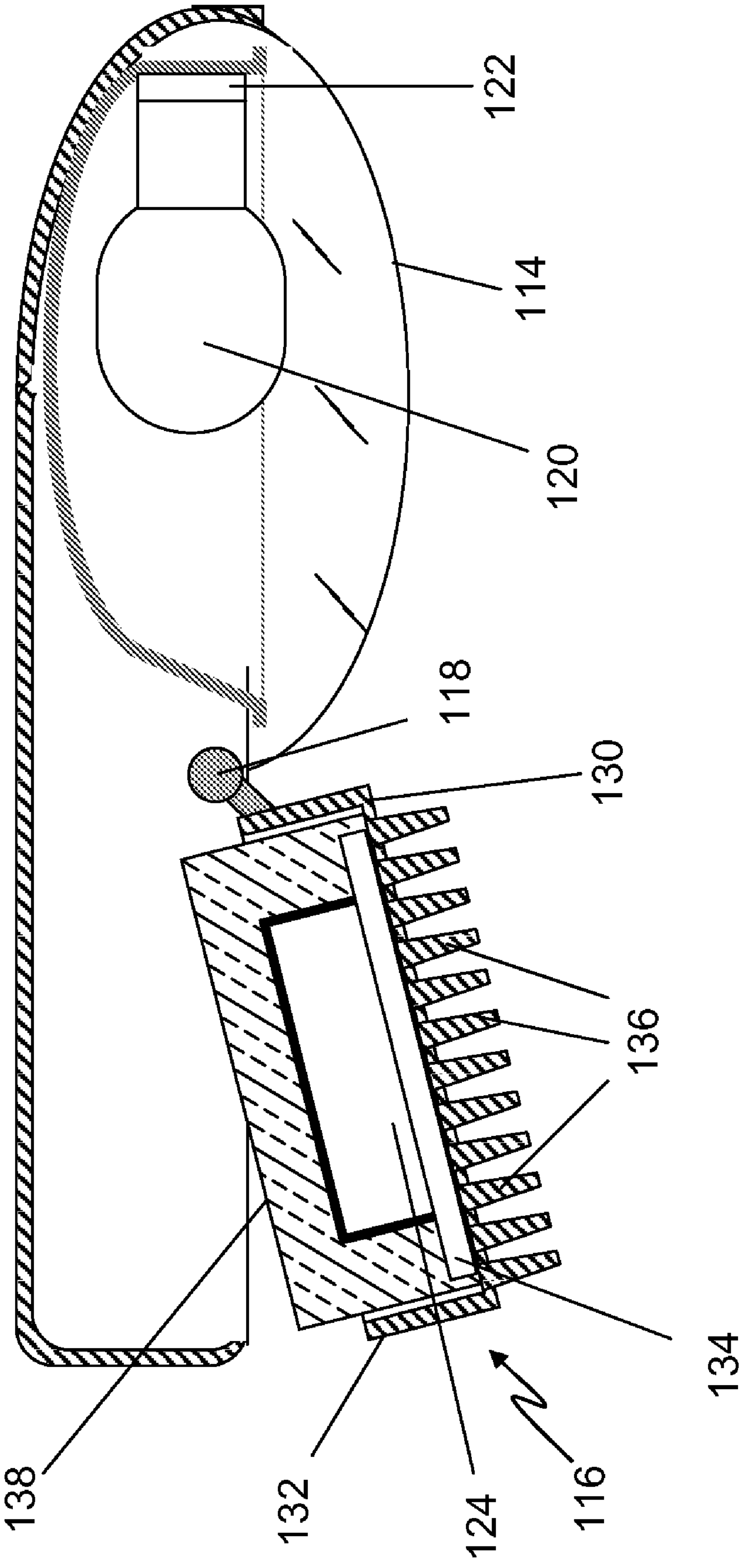
FIG. 6. Cross Section of Improved Heat Dissipation and Isolation System

In FIG. 6, there is a gate enclosure 116 that swings down via a detachable hinge 118, revealing the electronic components of the light fixture. Within the gate enclosure 116 are several components.

FIG. 6 shows the preferred embodiment of the solution to the heat dissipation problem. The present invention consists of a gate housing 116 which possesses a bottom panel 130 with side walls 132 extending upward into the body of the induction light fixture 112. There is a plurality of heat sink fins 136 extending downward from the lower surface of the bottom panel 130 that greatly increase the heat radiating surface area of the bottom panel 130. The electronic power stabilizer or ballast 124 has a flange 134 having a flat bottom surface that contacts most of the upper surface of the bottom panel 130. This contact facilitates heat transfer by conduction from the ballast 124 to the bottom panel 130, thence to the fins 136, and by convection and radiation to the outside air.

The side walls 132 are made from an insulating material. The ballast 124 housing, flange 134, bottom panel 130 and the heat sink fins 136 can all be made of any rigid material with good heat conducting properties. The preferred embodiment would use aluminum for these components, to minimize cost. The use of copper for these items is a possible alternate embodiment, at substantially increased cost.

Insulating material 138 would cover the upper surface of the flange 134 and ballast 124 housing. The insulating material 138 extends upward into the hollow space in the body of the induction light fixture 110. The insulating material can be comprised of any good heat insulator that operates well in the temperature range of 60 to 120 degrees Centigrade.

Figure 7:
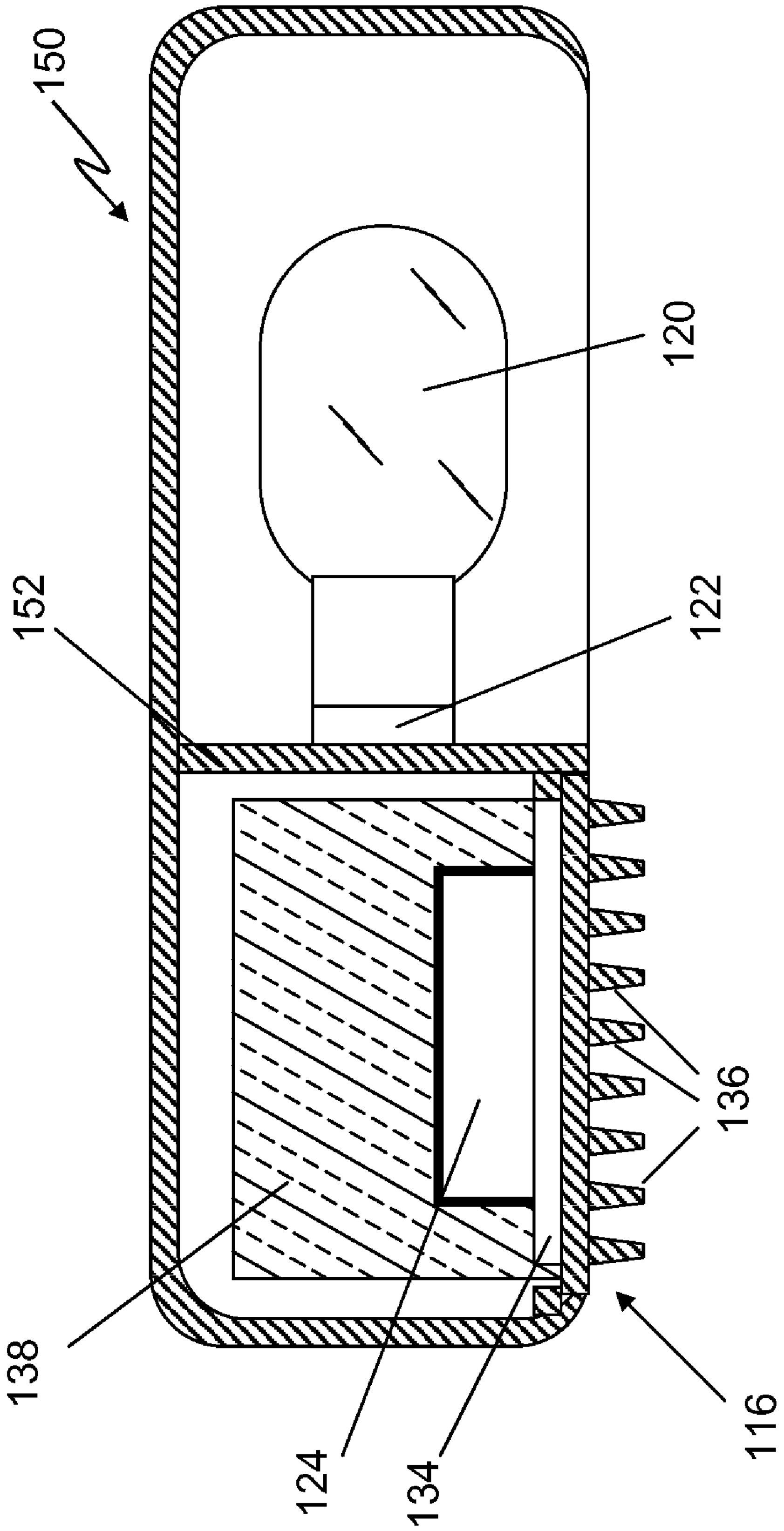
FIG. 7. Cross-Section of Alternate Heat Dissipation and Isolation System

In FIG. 7, an alternate embodiment of the light fixture is shown. The enclosure 150 possesses a wall 152 separating the ballast 124 from the power coupler 122 and the lamp envelope 120. The wall 152 confers additional heat isolation between the ballast 124 and the heat generating lamp 120 and makes the side walls 132 of the other embodiment unnecessary.

While the foregoing describes a preferred and an alternative embodiment of the invention, variation on this design and equivalent designs may be resorted to in the scope and spirit of the claimed invention.

What is claimed is:

1. An improved induction lighting system, the induction lighting system comprised of a power stabilizer enclosure and a lamp enclosure, the power stabilizer enclosure connected electrically to the lamp enclosure, the power stabilizer enclosure comprised of a power stabilizer enclosure body, a gate housing and a hinge, the gate housing connected rotatably to the power stabilizer enclosure body by means of the hinge, the gate housing also detachable from the power stabilizer at the hinge, the gate housing possessing a bottom panel with side walls that extend upward from the bottom panel such that the side walls extend into the power stabilizer enclosure body when the gate housing is swung up into the power stabilizer enclosure body by means of the hinge, the bottom panel possessing a plurality of heat sink fins on its lower surface, the heat sink fins extending downward from the lower surface of the bottom panel such that they are outside of the power stabilizer enclosure, the upper surface of the bottom panel possessing an electronic power stabilizer connected fixedly to the bottom panel by means of a flange with a flat bottom surface that contacts the upper surface of the bottom panel, the electronic power stabilizer, flange, bottom panel, and heat sink fins all made of a rigid material with good heat conducting properties, the side walls comprised of any rigid material with good heat insulating properties, the upper surface of the flange, the electronic power stabilizer and the balance of the upper surface of the bottom panel covered with heat insulating material such that the heat insulating material fills the power stabilizer enclosure body when the gate housing is swung up into the power stabilizer enclosure body, the heat insulating material comprised of any good heat insulator that operates in the temperature range of 100 or higher degrees Centigrade.

2. An improved induction lighting system as in claim 1 where the power stabilizer enclosure and the lamp enclosure are separated by an insulated wall, the power stabilizer enclosure and the lamp enclosure connected electrically by means of a wire transiting the insulated wall through an airtight hole.

3. An improved induction lighting system as in claim 1 and claim 2 where the rigid material comprising the electronic power stabilizer, flange, bottom panel, and heat sink fins is aluminum.

4. An improved induction lighting system as in claim 1 and claim 2 where the heat insulating material is foam plastic.

* * * * *